United States Patent
Ogi et al.

(10) Patent No.: US 12,163,992 B2
(45) Date of Patent: *Dec. 10, 2024

(54) CHARGE DETECTION SENSOR AND POTENTIAL MEASUREMENT SYSTEM

(71) Applicant: SONY SEMICONDUCTOR SOLUTIONS CORPORATION, Kanagawa (JP)

(72) Inventors: Jun Ogi, Tokyo (JP); Yuri Kato, Kanagawa (JP); Naohiko Kimizuka, Kanagawa (JP); Yoshihisa Matoba, Kanagawa (JP); Kan Shimizu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,517

(22) Filed: Aug. 11, 2023

(65) Prior Publication Data

US 2024/0036096 A1   Feb. 1, 2024

Related U.S. Application Data

(63) Continuation of application No. 16/646,185, filed as application No. PCT/JP2018/030255 on Aug. 14, 2018, now Pat. No. 11,754,610.

(30) Foreign Application Priority Data

Sep. 20, 2017   (JP) ................. 2017-179872

(51) Int. Cl.
  *G01R 29/24*   (2006.01)
  *G01N 27/414*   (2006.01)

(52) U.S. Cl.
  CPC ......... *G01R 29/24* (2013.01); *G01N 27/4145* (2013.01)

(58) Field of Classification Search
  CPC .. G01R 29/24; G01N 27/4145; G01N 27/414; H01L 2924/13073;
  (Continued)

(56) References Cited

U.S. PATENT DOCUMENTS

| | | | | |
|---|---|---|---|---|
| 4,636,827 A | * | 1/1987 | Rudolf ................. | G01N 27/414 257/253 |
| 6,184,120 B1 | * | 2/2001 | Tsuchiya ........... | H01L 21/76877 438/584 |

(Continued)

FOREIGN PATENT DOCUMENTS

| | | |
|---|---|---|
| CA | 2920140 A1 | 2/2015 |
| CN | 102254896 A | 11/2011 |

(Continued)

OTHER PUBLICATIONS

International Search Report and Written Opinion of PCT Application No. PCT/JP2018/030255, issued on Nov. 13, 2018, 08 pages of English Translation and 07 pages of ISRWO.

(Continued)

*Primary Examiner* — Earl N Taylor
(74) *Attorney, Agent, or Firm* — CHIP LAW GROUP

(57) ABSTRACT

To achieve decreased noise and improved sensitivity by reducing parasitic capacitance in a charge detection sensor. The charge detection sensor includes a detection element, a detection electrode, and a contact. The detection element is provided on one surface of a semiconductor substrate and detects a charge. The detection electrode is provided on another surface different from the one surface of the semiconductor substrate. The contact penetrates the semiconductor substrate and electrically connects the detection electrode (Continued)

and the detection element. Since no wiring layer is formed between the detection element and the detection electrode, the parasitic capacitance is reduced.

11 Claims, 13 Drawing Sheets

(58) Field of Classification Search
CPC ............. H01L 21/76898; H01L 23/055; H01L 23/49827; H01L 23/5384; H01L 33/382; H01L 21/486; H01L 2225/06541; H01L 2225/06548
See application file for complete search history.

(56) References Cited

U.S. PATENT DOCUMENTS

| | | | |
|---|---|---|---|
| 8,871,549 B2 * | 10/2014 | Ellis-Monaghan | H01L 29/66477 257/253 |
| 9,443,896 B2 * | 9/2016 | Hirase | H01L 27/14636 |
| 10,466,199 B2 * | 11/2019 | Lin | G01N 33/54373 |
| 11,034,998 B2 * | 6/2021 | Bashkirov | B01L 7/52 |
| 2005/0156207 A1 * | 7/2005 | Yazawa | G01N 27/414 257/288 |
| 2010/0270174 A1 * | 10/2010 | Chen | G01N 33/54313 205/792 |
| 2011/0162962 A1 * | 7/2011 | Mazellier | H01L 29/1602 438/1 |
| 2011/0284912 A1 * | 11/2011 | Sekine | H01L 21/76898 977/831 |
| 2012/0000274 A1 * | 1/2012 | Fife | G01N 27/4145 257/253 |
| 2012/0024700 A1 * | 2/2012 | Boccardi | G01N 27/4145 438/49 |
| 2013/0200438 A1 * | 8/2013 | Liu | G01N 27/4148 257/253 |
| 2013/0334619 A1 * | 12/2013 | Merz | H01L 29/66007 438/49 |
| 2013/0341734 A1 * | 12/2013 | Merz | H01L 21/82 438/49 |
| 2014/0225166 A1 * | 8/2014 | Ellis-Monaghan | H01L 29/66477 257/253 |
| 2014/0264467 A1 * | 9/2014 | Cheng | G01N 27/4148 257/253 |
| 2015/0137190 A1 * | 5/2015 | Kang | G01N 27/414 257/253 |
| 2015/0226698 A1 * | 8/2015 | Carlson | G01N 27/414 438/49 |
| 2016/0169835 A1 * | 6/2016 | Sakata | G01N 27/4145 204/403.01 |
| 2016/0187334 A1 * | 6/2016 | Herget | G01N 33/54353 506/18 |
| 2016/0356740 A1 * | 12/2016 | Parris | G01N 27/4148 |
| 2017/0023521 A1 * | 1/2017 | Kalnitsky | G01N 27/4145 |
| 2017/0184541 A1 * | 6/2017 | Lin | G01N 33/54373 |
| 2018/0164246 A1 * | 6/2018 | Chen | H01L 27/1203 |
| 2018/0195998 A1 * | 7/2018 | Kalnitsky | H01L 21/84 |
| 2020/0271710 A1 * | 8/2020 | Ogi | G01N 27/4145 |
| 2020/0319130 A1 * | 10/2020 | Shimizu | G01N 27/416 |
| 2021/0205804 A1 * | 7/2021 | Wu | C12Q 1/6869 |
| 2021/0207209 A1 * | 7/2021 | Pang | C12Q 1/6837 |

FOREIGN PATENT DOCUMENTS

| | | |
|---|---|---|
| CN | 103154718 A | 6/2013 |
| CN | 103426930 A | 12/2013 |
| CN | 105474007 A | 4/2016 |
| EP | 1557884 A2 | 7/2005 |
| EP | 2388814 A2 | 11/2011 |
| EP | 3032248 A1 | 6/2016 |
| FR | 3083001 A1 | 12/2019 |
| JP | 08-313479 A | 11/1996 |
| JP | 2004-132981 A | 4/2004 |
| JP | 2009-524046 A | 6/2009 |
| JP | 2012-009820 A | 1/2012 |
| JP | 2012-080873 A | 4/2012 |
| JP | 2013-533482 A | 8/2013 |
| JP | 2015-206803 A | 11/2015 |
| JP | 2016-038384 A | 3/2016 |
| JP | 2016-080370 A | 5/2016 |
| KR | 10-2011-0128247 A | 11/2011 |
| KR | 10-2013-0135384 A | 12/2013 |
| WO | 2007/084077 A1 | 7/2007 |
| WO | 2012/003363 A1 | 1/2012 |
| WO | 2012/165016 A1 | 12/2012 |
| WO | 2015/020131 A1 | 2/2015 |
| WO | 2018/192279 A1 | 10/2018 |
| WO | 2019/077814 A1 | 4/2019 |

OTHER PUBLICATIONS

International Preliminary Report on Patentability of PCT Application No. PCT/JP2018/030255, issued on Apr. 2, 2020, 08 pages of English Translation and 04 pages of IPRP.
Notice of Allowance for U.S. Appl. No. 16/646,185, issued on May 9, 2023, 8 pages.
Non-Final Office Action for U.S. Appl. No. 16/646,185, issued on Aug. 3, 2022, 11 pages.
Final Office Action for U.S. Appl. No. 16/646,185, issued on Feb. 1, 2023, 12 pages.

* cited by examiner

CHARGE DETECTION SENSOR AND POTENTIAL MEASUREMENT SYSTEM

CROSS REFERENCE TO RELATED APPLICATIONS

This application is a continuation application of U.S. patent application Ser. No. 16/646,185 filed on Mar. 11, 2020, which is a U.S. National Phase of International Patent Application No. PCT/JP2018/030255 filed on Aug. 14, 2018, which claims priority benefit of Japanese Patent Application No. JP 2017-179872 filed in the Japan Patent Office on Sep. 20, 2017. Each of the above-referenced applications is hereby incorporated herein by reference in its entirety.

TECHNICAL FIELD

The present technology relates to a charge detection sensor. Specifically, the present technology relates to a charge detection sensor and a potential measurement system using the charge detection sensor.

BACKGROUND ART

Conventionally, ion sensitive (IS) FET sensors that detect biological reactions using a metal-oxide-semiconductor field-effect transistor (MOSFET) have attracted attention. For example, a biomolecule measuring device having the ISFET sensors arranged in an array manner and detecting ions has been proposed (see, for example, Patent Document 1).

CITATION LIST

Patent Document

Patent Document 1: Japanese Patent Application Laid-Open No. 2015-072240

SUMMARY OF THE INVENTION

Problems to be Solved by the Invention

In the above-described conventional technology, ions in a solution are detected by connecting an ion sensitive film immersed in the solution and a gate of the MOSFET. However, this conventional technology has a structure in which a wiring layer is sandwiched between the ion sensitive film and the gate of the MOSFET, and capacitive coupling between wiring of the wiring layer and the ion sensitive film is increased, and there has been a possibility of reduction of sensitivity due to parasitic capacitance and noise mixing from a power supply line or a signal line.

The present technology has been made in view of such a situation, and an object is to achieve reduced noise and improved sensitivity by reducing parasitic capacitance in a charge detection sensor.

Solutions to Problems

The present technology has been made to solve the above-described problems, and the first aspect of the present technology is a charge detection sensor including: a detection element provided on one surface of a semiconductor substrate and configured to detect a charge; a detection electrode provided on the other surface different from another surface of the semiconductor substrate; and a contact that penetrates the semiconductor substrate and electrically connects the detection electrode and the detection element. This brings about an effect of electrically connecting the detection element and the detection electrode provided on the different surfaces from each other of the semiconductor substrate by the contact to enable charge detection and reducing parasitic capacitance of the detection electrode.

Furthermore, in the first aspect, the detection element may be a MOSFET, and a gate of the detection element and the detection electrode may be electrically connected via a conductor or a capacitor. This brings about an effect of electrically connecting the MOSFET and the detection electrode by the contact via the conductor or capacitance to enable charge detection and reducing parasitic capacitance of the detection electrode.

Furthermore, in the first aspect, the contact may be a metal buried plug-type contact or may be a silicon through electrode-type contact.

Furthermore, in the first aspect, a wiring layer provided on the one surface of the semiconductor substrate and configured to connect the contact and a terminal of the detection element may be further provided. Even in this case, since the wiring layer is provided on the different surface from the detection electrode, capacitive coupling between the detection electrode and the wiring layer is reduced. Meanwhile, the contact may be directly connected to a terminal of the detection element without using a wiring layer.

Furthermore, in the first aspect, the semiconductor substrate may be separated into a first semiconductor substrate and a second semiconductor substrate by an oxide film, the first semiconductor substrate may be provided with the detection element, and the second semiconductor substrate may be a highly doped substrate electrically connected with the detection electrode at a same potential. This brings about an effect of reducing resistance between the second semiconductor substrate and the detection electrode, and increasing the capacitance between the detection electrode and the detection element to improve sensitivity.

Furthermore, in the first aspect, an element array in which pairs of the detection element and the detection electrode connected to the contact are arranged in a two-dimensional array manner may be provided. This brings about an effect of grasping a distribution of charges in a two-dimensional manner.

Furthermore, in the first aspect, a structure in which a first substrate including the element array and a second substrate including at least a part of a reading circuit that reads the detected charge are stacked and connected may be provided. This is caused by the fact that by providing the detection electrode on the different surface from the detection element in the semiconductor substrate, a land necessary for stacking becomes able to be provided.

Furthermore, in the first aspect, the connection between the first substrate and the second substrate to be stacked may be connection between copper electrodes or may be connection between solder bumps.

Furthermore, in the first aspect, at least a part of the reading circuit connected to a plurality of the detection elements may be integrated on the second substrate or a part of the reading circuit connected to the single detection element may be divided into the first substrate and the second substrate.

Furthermore, in the first aspect, the detection element may detect ions in a solution in contact with the detection electrode.

Furthermore, in the first aspect, the charge detection sensor may be a biosensor configured to measure a biological activity or specify a biological substance by detecting the charge.

Furthermore, the second aspect of the present technology may be a potential measurement system including: a charge detection sensor including a detection element provided on one surface of a semiconductor substrate and configured to detect a charge, a detection electrode provided on another surface different from the one surface of the semiconductor substrate, and a contact that penetrates the semiconductor substrate and electrically connects the detection electrode and the detection element, the charge detection sensor being configured to perform potential measurement; a control unit configured to control the potential measurement in the charge detection sensor; a measurement result processing unit configured to process a measurement result by the charge detection sensor; and a display unit configured to display the processed measurement result. This brings about an effect of processing the measurement result by the charge detection sensor and displaying the measurement result as an image or a moving image.

Effects of the Invention

According to the present technology, an excellent effect of achieving reduced noise and improved sensitivity by reducing parasitic capacitance in a charge detection sensor. Note that effects described here are not necessarily limited, and any of effects described in the present disclosure may be exerted

MODE FOR CARRYING OUT THE INVENTION

Hereinafter, modes for implementing the present technology (hereinafter referred to as embodiments) will be described. Description will be given according to the following order.
1. First Embodiment (an example using a metal buried plug-type contact)
2. Second Embodiment (an example using a silicon through electrode-type contact)
3. Third Embodiment (an example of being in direct contact with a gate of a MOSFET)
4. Fourth Embodiment (an example using a substrate separated by an oxide film)
5. Fifth Embodiment (an example of stacking reading circuits)
6. Sixth Embodiment (an example of being applied to a potential measurement system)

1. FIRST EMBODIMENT

Figure 1:
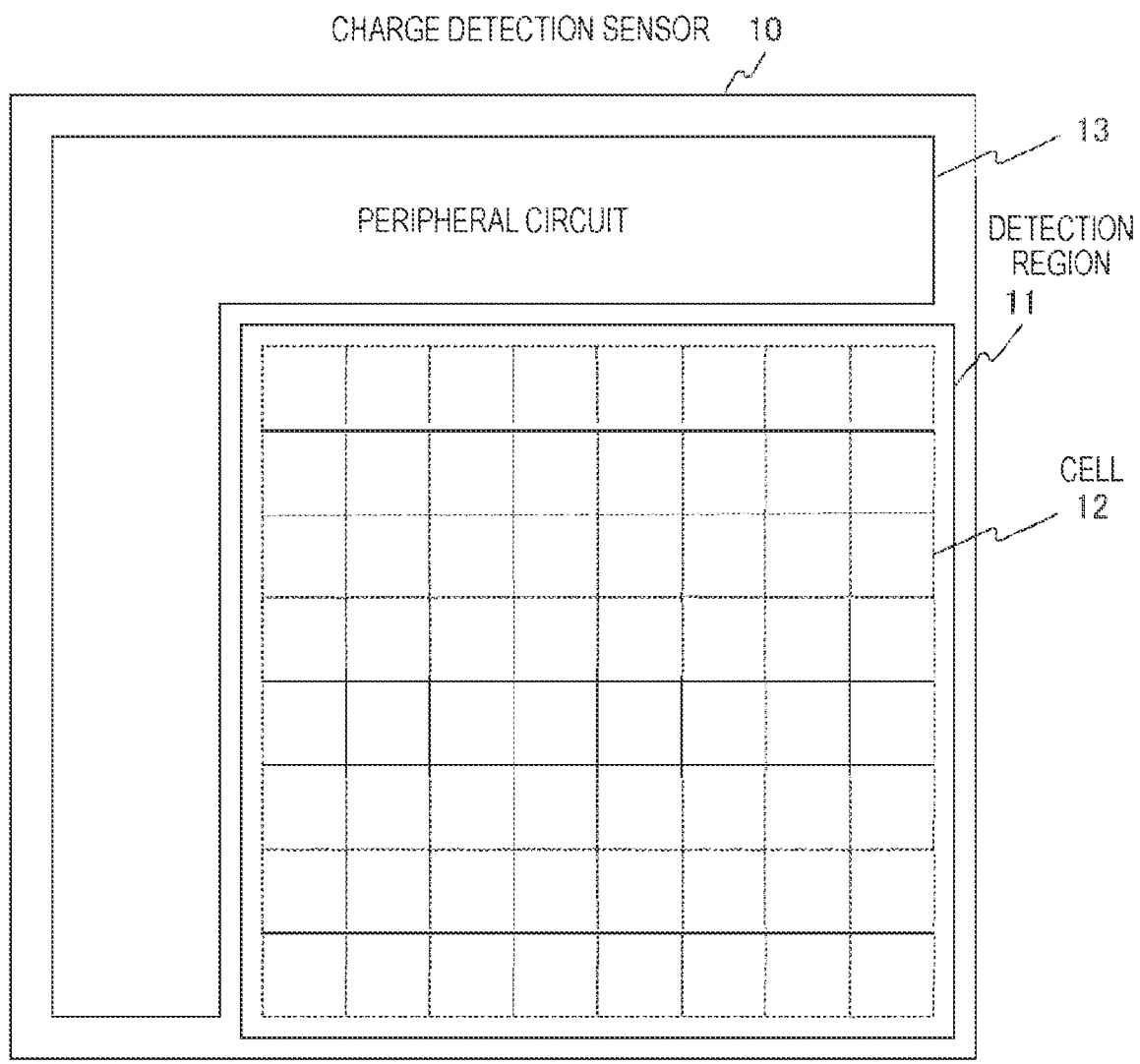
FIG. 1 is a diagram illustrating an example of an appearance of a charge detection sensor 10 according to an embodiment of the present technology as viewed from above.

[Charge Detection Sensor]
FIG. 1 is a diagram illustrating an example of an appearance of a charge detection sensor 10 according to an embodiment of the present technology as viewed from above. The charge detection sensor 10 is a sensor that detects charges in a solution. A detection region 11 is provided on an upper surface of the charge detection sensor 10, and a solution serving as a sample is immersed in the detection region 11.

The charge detection sensor 10 includes a plurality of cells 12 each including a detection element, and the plurality of cells 12 is arranged in a two-dimensional array manner to form an element array. Each of the plurality of cells 12 detects a charge. Furthermore, the charge detection sensor 10 is provided with a peripheral circuit 13 for reading the detected charge. Note that, in this example, an 8×8 element array is illustrated. However, this is only an example, and an element array having any size can be formed as necessary.

Each of the plurality of cells 12 has a MOSFET as the detection element. A sensor that detects a charge using a MOSFET in this way is called ISFET sensor. An example using an N-channel MOSFET will be described below, but other types of transistors such as bipolar transistors can also be used.

Figure 2:
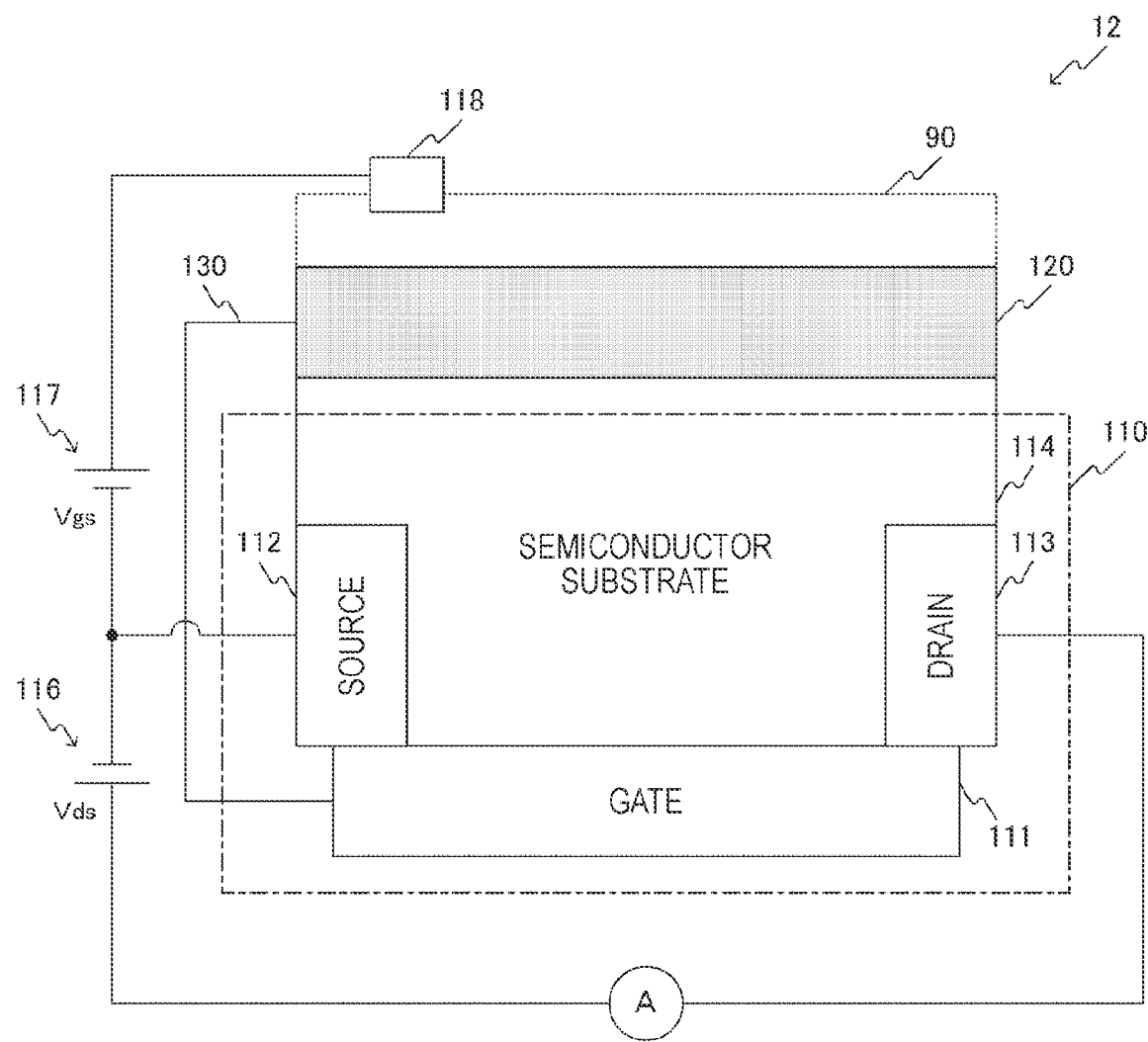
FIG. 2 is a diagram illustrating an example of a circuit image of a cell 12 of the charge detection sensor 10 according to the embodiment of the present technology.

FIG. 2 is a diagram illustrating an example of a circuit image of the cell 12 of the charge detection sensor 10 according to the embodiment of the present technology. The cell 12 includes a MOSFET 110 and a detection electrode 120.

The MOSFET 110 is a detection element that detects a charge, and terminals of a gate 111, a source 112, and a drain 113 are formed on a semiconductor substrate 114. Here, description will be made assuming an N-channel MOSFET 110 in which the semiconductor substrate 114 is P-type silicon and the source 112 and the drain 113 are N-type regions. Note that the MOSFET 110 is an example of a detection element described in the claims.

The detection electrode 120 is an electrode in contact with a solution 90. The detection electrode 120 is electrically connected to the gate 111 of the MOSFET 110 via a contact 130. That is, the MOSFET 110 can detect a potential of the detection electrode 120 at the gate 111. The material of the detection electrode 120 needs to be water-insoluble, and for example, platinum (Pt) or the like is used. However, titanium nitride (TiN), gold (Au), or the like may be used as another metal material. Furthermore, the detection electrode 120 may have a structure of being in contact with the solution via an insulating film or the like without exposing a metal surface.

A reference electrode 118 is an electrode for applying a voltage to the solution 90. The reference electrode 118 is connected to the source 112 of the MOSFET 110 via a power supply 117, and the power supply 117 applies a gate voltage Vgs. Meanwhile, a power supply 116 is connected between the source 112 and the drain 113, and the power supply 116 applies a bias voltage Vds. Furthermore, in this example, an ammeter 250 is connected between the source 112 and the drain 113 and measures a current flowing between the source 112 and the drain 113. Furthermore, as another example, an input potential fluctuation of the gate may be read as a potential fluctuation of the drain as an output terminal, using a differential amplifier circuit, as will be described below. Thereby, ions in the solution 90 can be measured.

[Structure]

Figure 3:
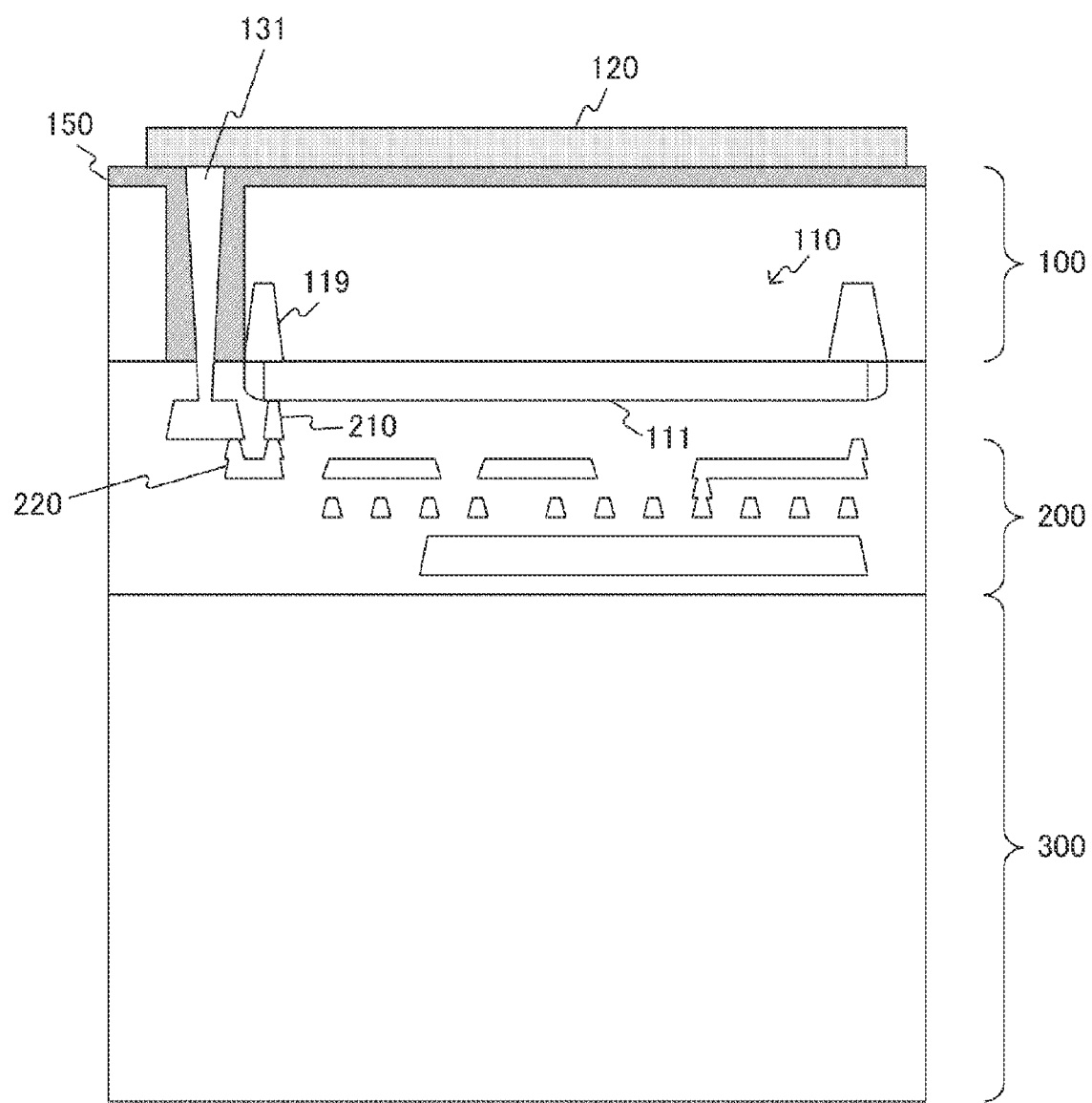
FIG. 3 is a diagram illustrating a cross section of an example of the charge detection sensor 10 according to the first embodiment of the present technology.

FIG. 3 is a diagram illustrating a cross section of an example of the charge detection sensor 10 according to the first embodiment of the present technology.

The MOSFET 110 is formed on a surface (a lower surface in FIG. 3) of a semiconductor substrate 100. Meanwhile, the detection electrode 120 is formed on a back surface (an upper surface in FIG. 3) of the semiconductor substrate 100 via an insulating film 150. Furthermore, a through contact 131 penetrating the semiconductor substrate 100 is formed from the back surface to the front surface of the semiconductor substrate 100. Note that the through contact 131 is an example of a contact described in the claims. In this example, as the contact 130, a plug-type through contact 131 is assumed in which an insulating film and a conductor such as metal are embedded in a through hole penetrating the semiconductor substrate 100. As the material for the insulating film, for example, silicon dioxide ($SiO_2$) is used. As the conductor metal, for example, tungsten (W) is used, but other insulating materials, or conductors such as metals or polysilicon may be used.

The through contact 131 is formed outside a shallow trench isolation (STI) 119 of the MOSFET 110 because of penetrating the semiconductor substrate 100. Note that the STI 119 is an element isolation unit for preventing an interference with other adjacent transistors.

A wiring layer 200 is formed on the surface side of the semiconductor substrate 100. The wiring layer 200 is supported by a lower support substrate 300. The support substrate 300 is a substrate used for maintaining strength, and its thickness is assumed to be about 500 micrometers, for example. In the wiring layer 200, wiring 220 is formed in an insulating layer. As the material of the wiring 220, for example, aluminum (Al), copper (Cu), or the like is used. A circuit of the semiconductor substrate 100 is connected to the wiring 220 of the wiring layer 200 via a contact 210, for example.

In this example, the detection electrode 120 is once connected to the wiring 220 of the wiring layer 200 via the through contact 131. Then, the detection electrode 120 is connected to the gate 111 of the MOSFET 110 via the contact 210. Therefore, a structure in which the wiring layer 200 is not sandwiched between the detection electrode 120 and the gate 111 is obtained, whereby capacitive coupling between the detection electrode 120 and the wiring layer 200 can be reduced.

Note that, in this example, an example in which the detection electrode 120 is connected to the gate 111 of the MOSFET 110 has been described. However, the detection electrode 120 may be connected to the terminal of the source 112 or the drain 113 of the MOSFET 110.

As described above, according to the first embodiment of the present technology, the detection electrode 120 and the gate 111 are connected via the through contact 131 and the wiring 220, whereby the capacitive coupling of the detection electrode 120 with the wiring layer 200 is reduced and noise is decreased, and sensitivity can be improved.

2. Second Embodiment

In the above-described first embodiment, as the contact 130, the plug-type through contact 131 in which an insulating film and a conductor such as metal are embedded in a through hole penetrating the semiconductor substrate 100 has been assumed. In a second embodiment, a drop through-silicon via (TSV)-type through contact 132 in which a conductor such as metal is attached to a bottom and a side wall of a large-diameter hole is assumed. Note that, since a basic configuration of a charge detection sensor is similar to that of the above-described first embodiment, detailed description is omitted.

[Structure]

Figure 4:
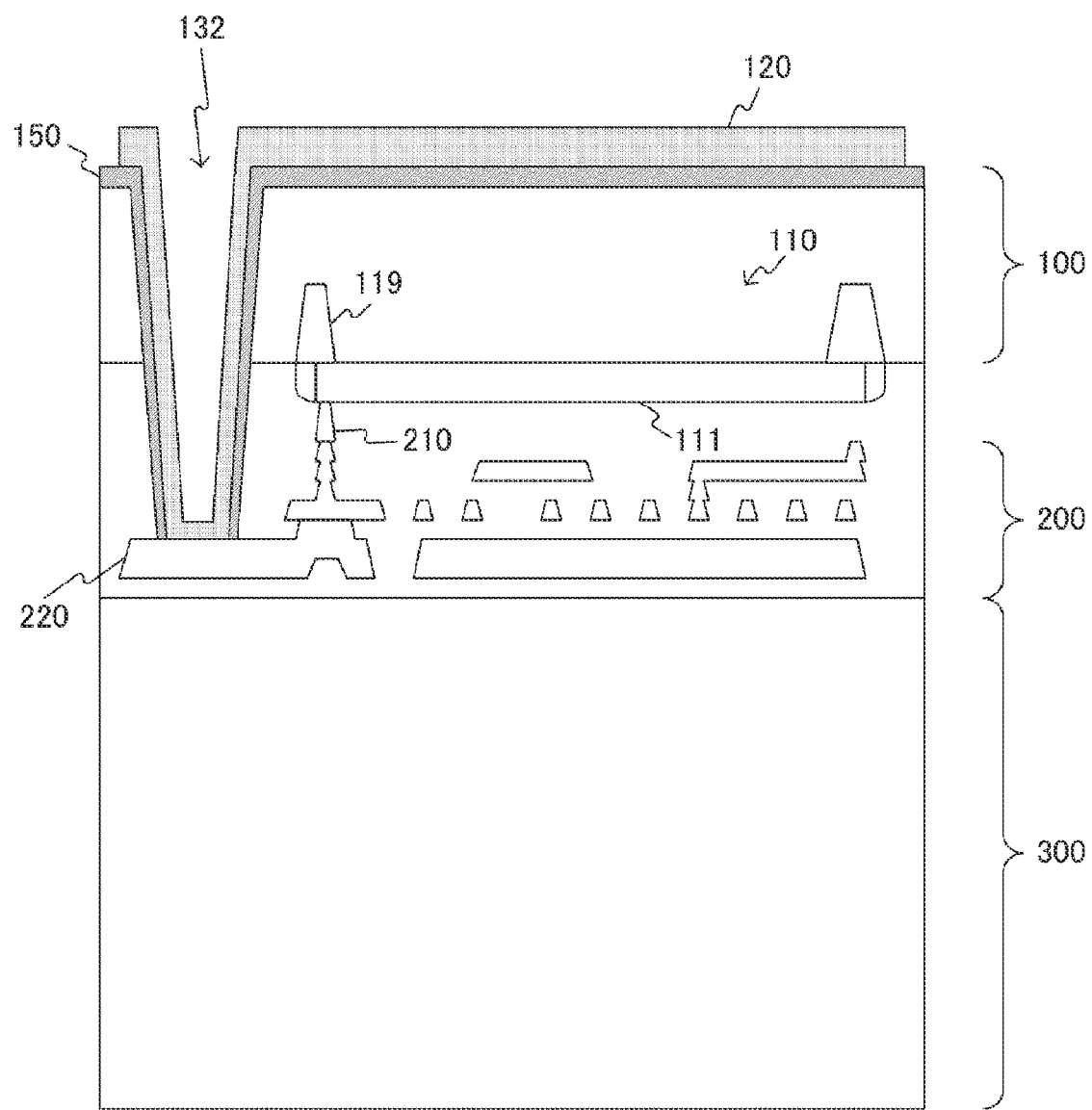
FIG. 4 is a diagram illustrating a cross section of an example of a charge detection sensor 10 according to a second embodiment of the present technology.

FIG. 4 is a diagram illustrating a cross section of an example of a charge detection sensor 10 according to the second embodiment of the present technology.

In this example, as a contact 130, the drop TSV-type through contact 132 in which a conductor such as metal is attached to a bottom and a side wall of a large-diameter hole is assumed. As the conductor metal in this case, the same metal as that for a detection electrode 120 is assumed but other insulating materials, or conductors such as metals or polysilicon may be used. Note that the through contact 132 is an example of a contact described in the claims.

Even in this case, the detection electrode 120 is once connected to wiring 220 of a wiring layer 200 via the through contact 132, similarly to the above-described first embodiment. Then, the detection electrode 120 is connected to a gate 111 of a MOSFET 110 via a contact 210. Therefore, a structure in which the wiring layer 200 is not sandwiched between the detection electrode 120 and the gate 111 is obtained, whereby capacitive coupling between the detection electrode 120 and the wiring layer 200 can be reduced, similarly to the above-described first embodiment.

As described above, according to the second embodiment of the present technology, the detection electrode 120 and the gate 111 are connected via the through contact 132 and the wiring 220, whereby the capacitive coupling of the detection electrode 120 with the wiring layer 200 is reduced and noise is decreased, and sensitivity can be improved.

3. Third Embodiment

In the above-described first and second embodiments, the detection electrode 120 has been connected to the gate 111 of the MOSFET 110 after once connected to the wiring 220 of the wiring layer 200 via the through contact 131 or 132. In contrast, in a third embodiment, a structure of being in direct contact with a gate 111 of a MOSFET 110 is adopted.

Note that, since a basic configuration of a charge detection sensor is similar to that of the above-described first embodiment, detailed description is omitted.
[Structure]

Figure 5:
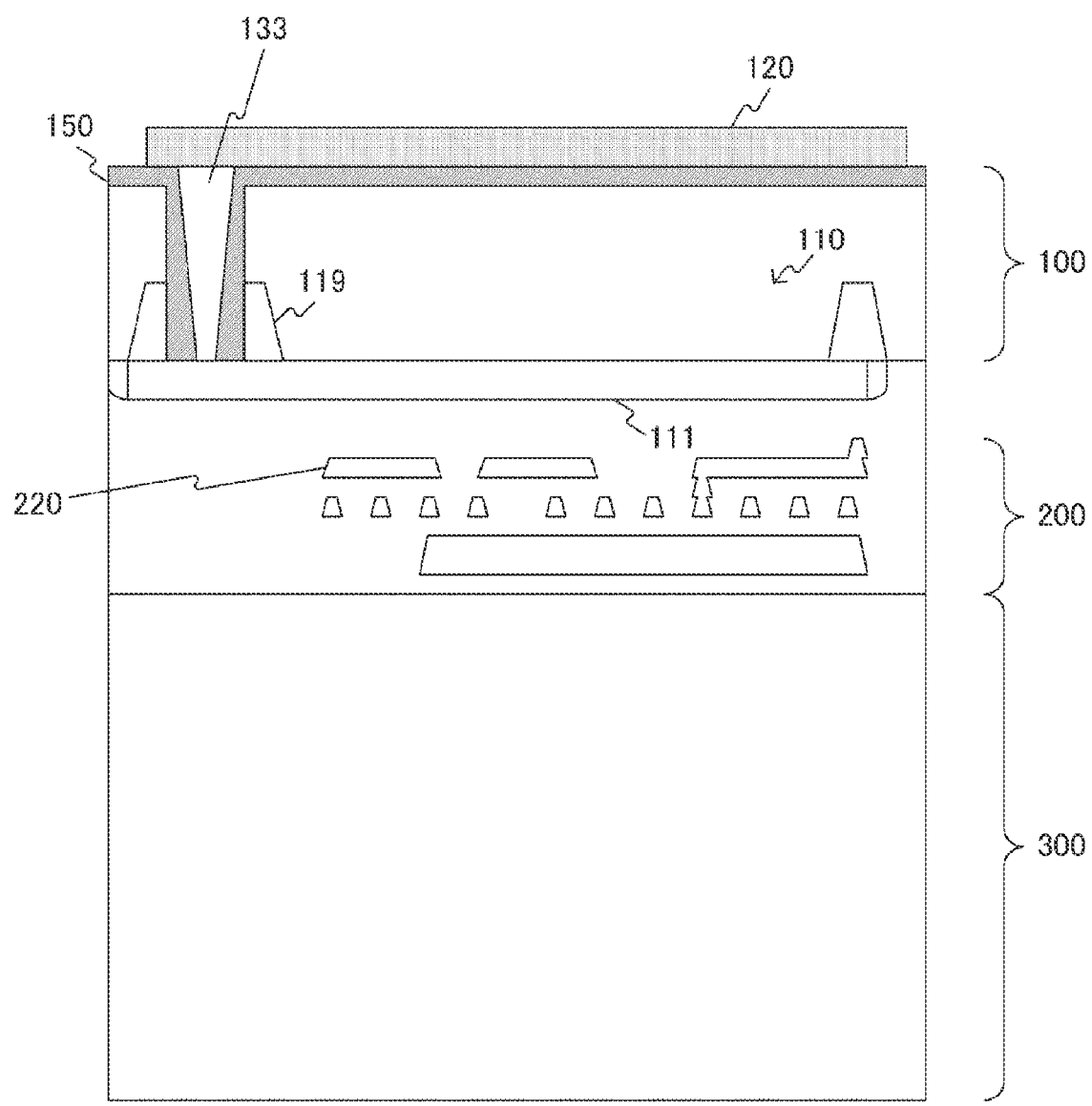
FIG. 5 is a diagram illustrating a cross section of an example of a charge detection sensor 10 according to a third embodiment of the present technology.

FIG. 5 is a diagram illustrating a cross section of an example of a charge detection sensor 10 according to the third embodiment of the present technology.

In this example, a through contact 133 is in direct contact with the gate 111 of the MOSFET 110. In this case, since the through contact 133 cannot be connected to a channel region of MOSFET 110, the through contact 133 is connected to an inside of an STI 119. According to the structure, since the connection path between the detection electrode 120 and the gate 111 does not go through the wiring layer 200, capacitive coupling between signal wiring and power supply wiring of the wiring layer 200 and wiring of the detection electrode 120 can be further reduced. Note that the through contact 133 is an example of a contact described in the claims.

As described above, according to the third embodiment of the present technology, the through contact 133 is directly connected with the gate 111 of the MOSFET 110, whereby the capacitive coupling between the detection electrode 120 and the wiring layer 200 is further reduced and noise is decreased, and sensitivity can be improved.

[Modification]

Figure 6:
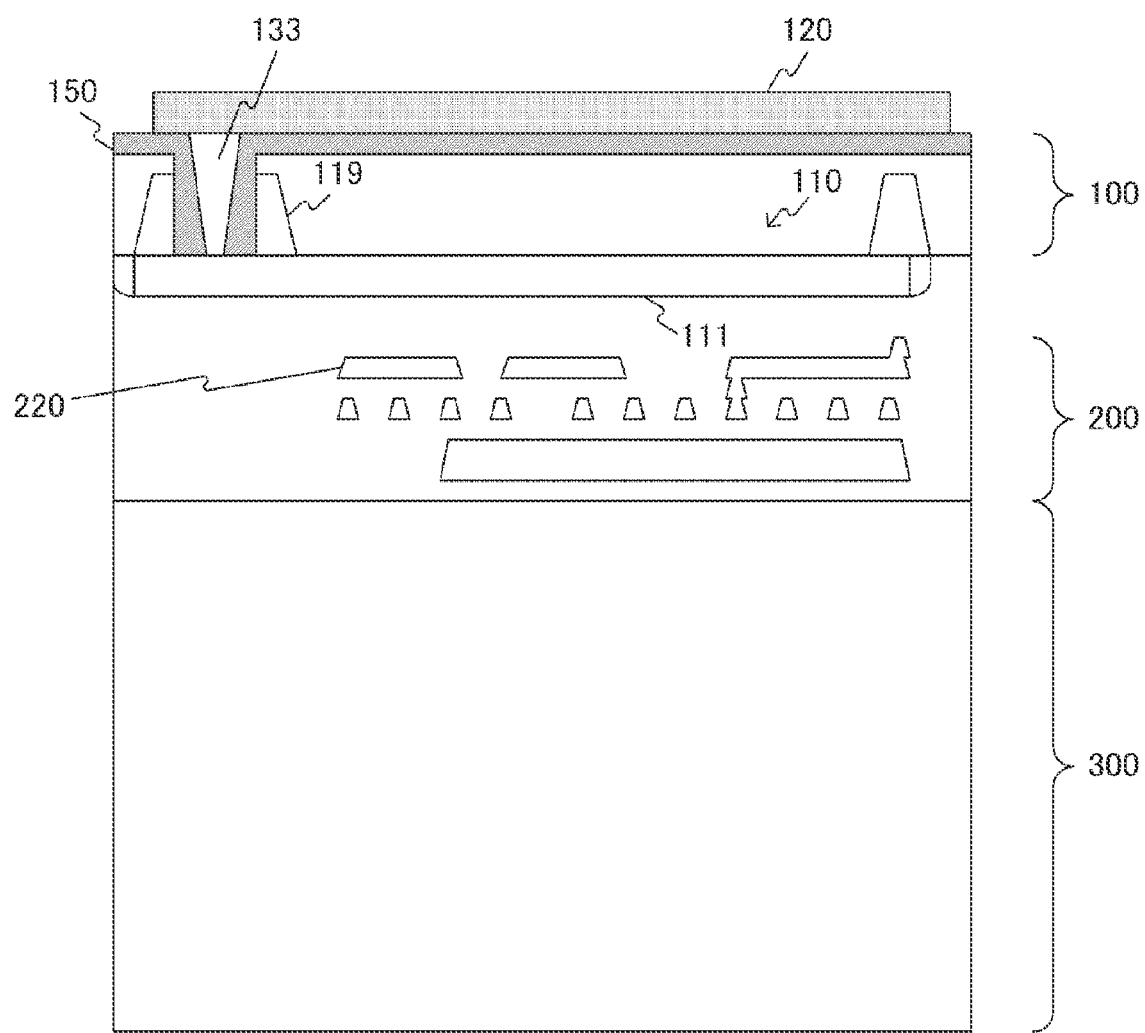
FIG. 6 is a diagram illustrating a cross section of an example of a charge detection sensor 10 according to a modification of the third embodiment of the present technology.

FIG. 6 is a diagram illustrating a cross section of an example of a charge detection sensor 10 according to a modification of the third embodiment of the present technology.

In the above-described embodiment, the capacitive coupling between the detection electrode 120 and the wiring layer 200 has been reduced. In the meantime, the capacitance between the detection electrode 120 and the MOSFET 110 is desirably large to improve the sensitivity. Therefore, in this modification, the thickness of a semiconductor substrate 100 is made thin to shorten the distance between the detection electrode 120 and the MOSFET 110, thereby increasing the capacitance between the detection electrode 120 and the MOSFET 110. As the thickness of such a semiconductor substrate 100, about several hundreds of nanometers is assumed, for example. Note that, here, the modification has been described as a modification of the third embodiment. However, the thickness of the semiconductor substrate 100 may be made thin to shorten the distance between the detection electrode 120 and the MOSFET 110 by applying the modification to the above-described first or second embodiment.

4. Fourth Embodiment

In the above-described first to third embodiments, the structure in which the insulating film 150 is provided between the detection electrode 120 and the semiconductor substrate 100 has been described, but another structure is also conceivable. In a fourth embodiment, an example using a semiconductor substrate separated by a buried oxide film will be described. Note that, since a basic configuration of a charge detection sensor is similar to that of the above-described first embodiment, detailed description is omitted.
[Structure]

Figure 7:
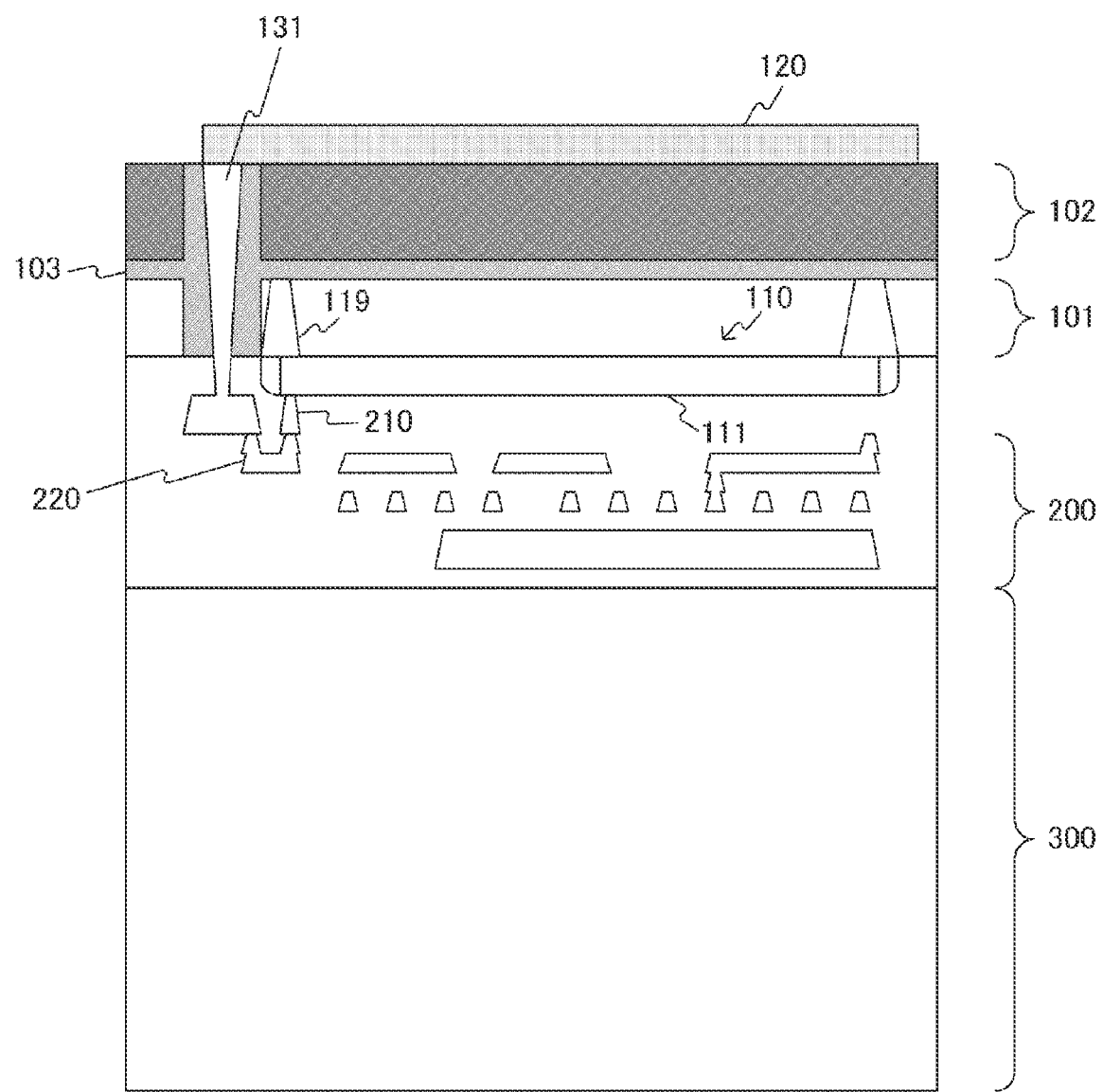
FIG. 7 is a diagram illustrating a cross section of an example of a charge detection sensor 10 according to a fourth embodiment of the present technology.

FIG. 7 is a diagram illustrating a cross section of an example of a charge detection sensor 10 according to the fourth embodiment of the present technology.

In this example, a structure in which semiconductor substrates 101 and 102 are separated by a buried oxide film 103 is adopted. As the semiconductor substrate 101 on which a MOSFET 110 is formed, for example, use of silicon on insulator (SOI) is assumed. This SOI is a silicon substrate provided on an insulator (here, the buried oxide film 103). Note that the semiconductor substrate 101 and the buried oxide film 103 are favorably as thin as possible. For example, the thickness is assumed to be 100 nanometers or less.

Meanwhile, the semiconductor substrate 102 on a back surface side is a highly doped substrate and is in contact with a detection electrode 120 without an insulating film. By causing the highly doped substrate to be in contact with the detection electrode 120, the resistance between the highly doped substrate and the detection electrode 120 can be reduced. As a result, the detection electrode 120 and the semiconductor substrate 102 have the same potential and function as a back gate of the MOSFET 110. As a resistance value in this case, for example, several tens of milliohms or less is assumed. To further reduce the resistance, for example, it is useful to silicide a contact surface.

By causing the semiconductor substrate 102 and the detection electrode 120 to have the same potential, the capacitance between the detection electrode 120 and a gate 111 of the MOSFET 110 increases. Thereby, sensitivity is further improved.

As described above, according to the fourth embodiment of the present technology, by causing the detection electrode 120 and the semiconductor substrate 102 to have the same potential, capacitive coupling between the detection electrode 120 and the gate 111 of the MOSFET 110 is strengthened, and sensitivity can be further improved.

5. Fifth Embodiment

Conventionally, since an ion-sensitive film has been provided on a wiring layer side of a semiconductor substrate and it has been favorable to make the area of the ion-sensitive film as large as possible, it has been difficult to secure regions where lands for stacking other chips are formed. In the case of using the present technology, a detection electrode 120 is formed on a back surface of a semiconductor substrate 100 (or 101 or 102), and thus regions where lands are formed can be secured on a front surface side of the semiconductor substrate 100, and chips can be stacked using the lands. Therefore, in a fifth embodiment, a structure of the case of stacking chips will be described. Note that, here, the structure of the charge detection sensor of the above-described fourth embodiment is assumed as an example, but another structure may be used.
[Structure]

Figure 8:
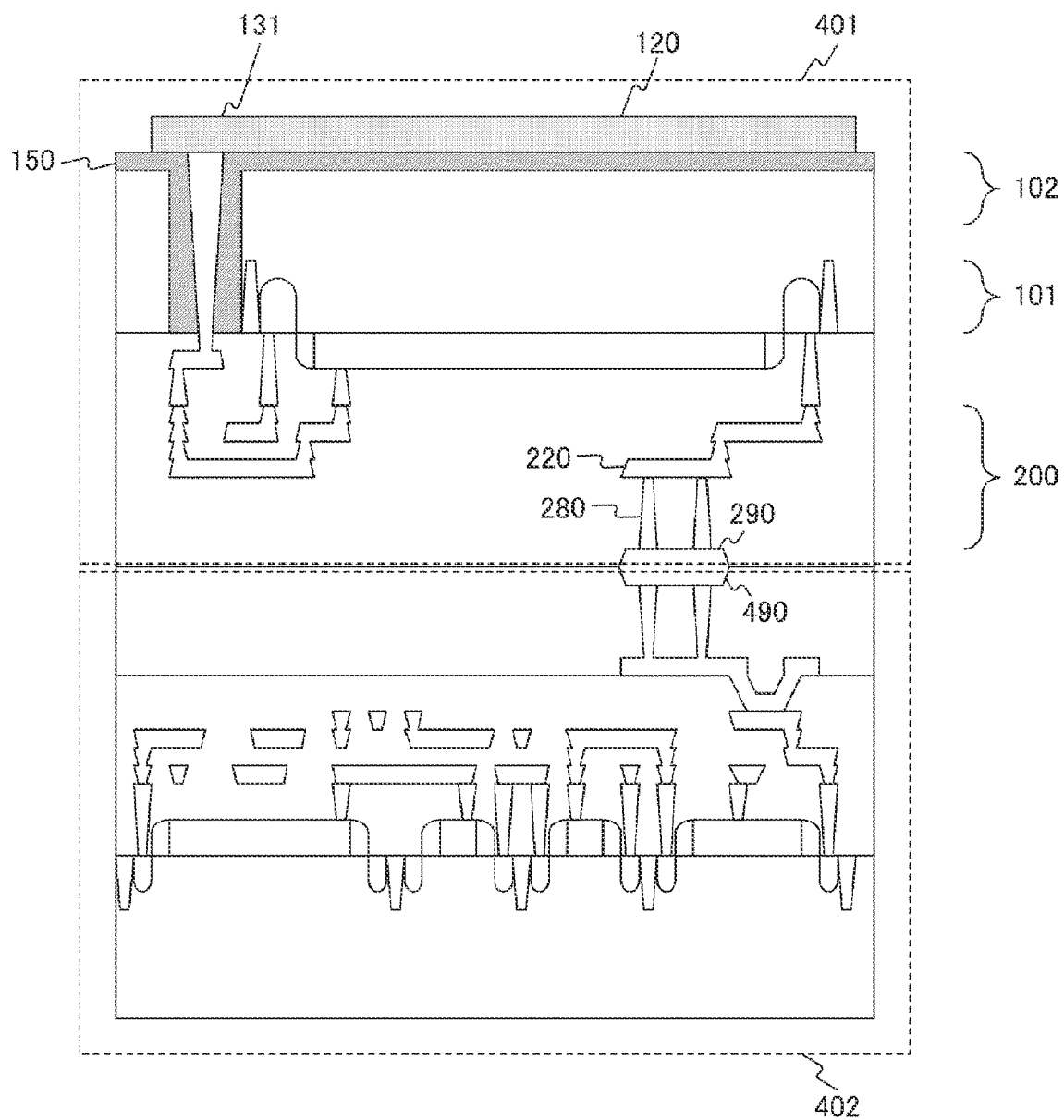
FIG. 8 is a diagram illustrating a cross section of an example of a charge detection sensor 10 according to a fifth embodiment of the present technology.

FIG. 8 is a diagram illustrating a cross section of an example of a charge detection sensor 10 according to the fifth embodiment of the present technology.

In this example, the charge detection sensor according to the above-described first embodiment is used as a sensing chip 401, and a land 290 for connection between copper electrodes (Cu—Cu connection) is formed on an uppermost part (a lower part in FIG. 8) of a wiring layer 200 of the sensing chip 401. The land 290 and wiring 220 of the wiring layer 200 are connected by a contact 280. Note that the connection position between the copper electrodes may be a cause of noise in a case where the connection position is close to the through contact 131, and is thus desirably located some distance away.

Meanwhile, a land 490 for a copper electrode is similarly formed on a reading chip 402 including a reading circuit. The lands 290 and 490 thus formed are bonded together to connect the copper electrodes. Thereby, a chip stacked sensor having each cell connected with high density can be created.

Figure 9:
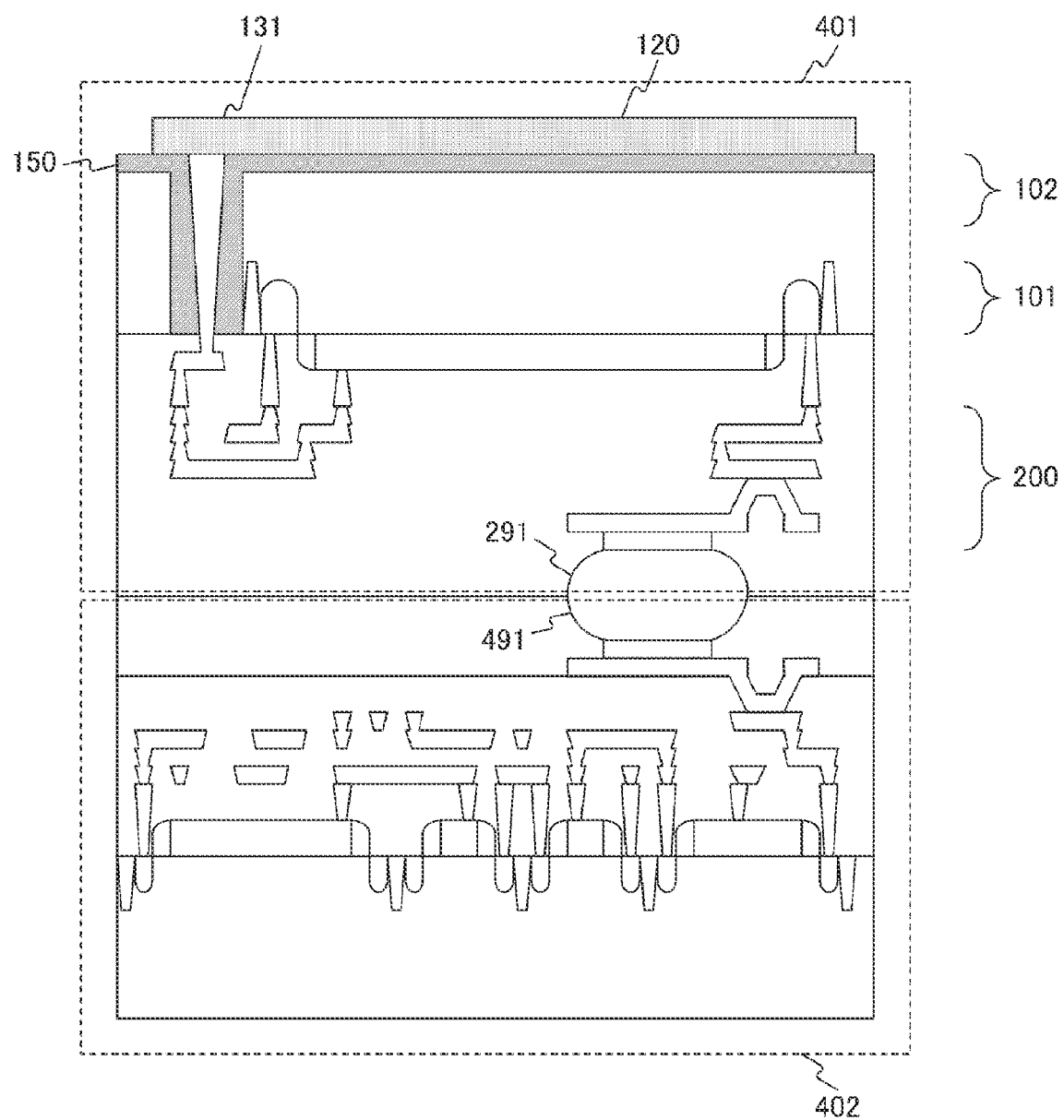
FIG. 9 is a diagram illustrating a cross section of another example of the charge detection sensor 10 according to the fifth embodiment of the present technology.

FIG. 9 is a diagram illustrating a cross section of another example of the charge detection sensor 10 according to the fifth embodiment of the present technology.

In this example, connection by solder bumps is assumed instead of the connection between copper electrodes. That is, a solder bump 291 is formed on the sensing chip 401 and a solder bump 491 is formed on the reading chip 402. Then, the solder bumps 291 and 491 formed in this way are fused to be connected.

[Division of Circuit]

Figure 10:
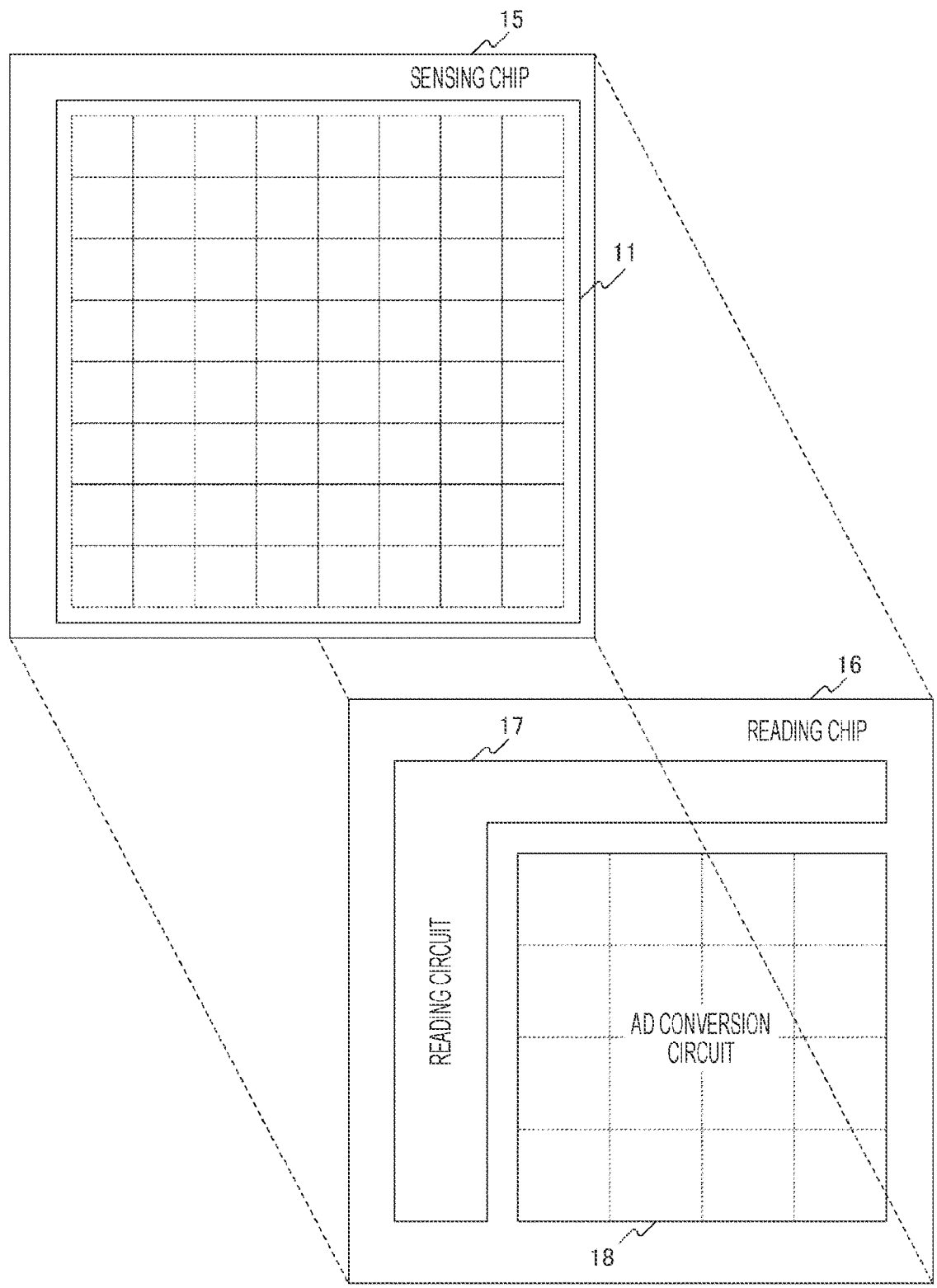
FIG. 10 is a diagram illustrating an outline example of chip division in the fifth embodiment of the present technology.

FIG. 10 is a diagram illustrating an outline example of chip division in the fifth embodiment of the present technology. In the fifth embodiment, high density is achieved by stacking a plurality of chips. That is, a sensing chip 15 in which a detection region 11 is mainly secured and a reading chip 16 in which a circuit for reading a detected electric charge is formed are stacked as separate chips. As a circuit for reading the detected charge, an analog-to-digital (AD) conversion circuit 18 and another reading circuit 17 are assumed. Various modes as described below are conceivable according to requirements of the system as to on which chips these circuits are accommodated.

Figure 11:
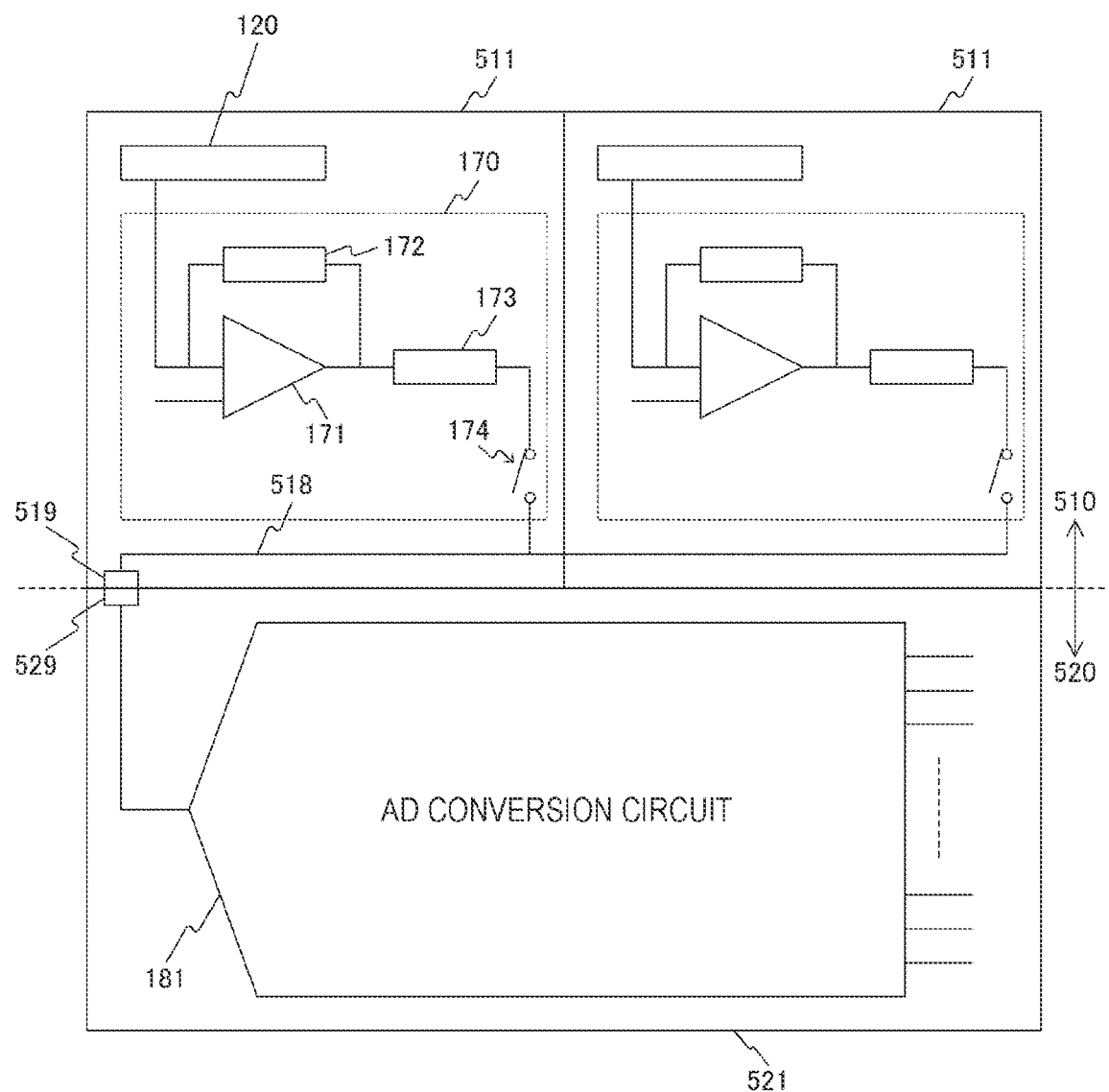
FIG. 11 is a diagram illustrating an example of the chip division in the fifth embodiment of the present technology.

FIG. 11 is a diagram illustrating an example of the chip division in the fifth embodiment of the present technology. In this example, it is assumed that an AD conversion circuit 181 that is normally integrated in a periphery outside a cell array is mounted on a reading chip 520 immediately below the cell array, and another reading circuit 170 is mounted on a sensing chip 510.

The sensing chip 510 includes a detection electrode 120 and the reading circuit 170 for each cell 511. The reading circuit 170 includes an amplifier circuit 171 and frequency band limiting filters 172 and 173. The reading circuit 170 is connected to a signal line 518 via a selection switch 174. The signal line 518 is connected to a land 519 formed on the sensing chip 510. In this division example, the AD conversion circuit 181 is mounted on the reading chip 520, and the another reading circuit 170 is mounted on the sensing chip 510. Note that, in this circuit configuration example, a first-stage transistor (often a MOSFET) included in the amplifier circuit 171 can be used as a detection element. The reading chip 520 includes a peripheral circuit 521 including the AD conversion circuit 181 corresponding to a plurality of cells 511. The AD conversion circuit 181 is connected to a land 529 formed on the reading chip 520.

The land 519 formed on the sensing chip 510 and the land 529 formed on the reading chip 520 are connected by, for example, connection between copper electrodes, but solder bumps may be used as described above.

As described above, by mounting the AD conversion circuit 181 that is normally mounted in a circuit around the cell array on the reading chip 520 and stacking the AD conversion circuit 181 immediately below the cell array, the circuit area around the cell array can be reduced and the chip area can be reduced. Furthermore, by increasing the number of AD conversion circuits 181 for one cell 511, high-speed reading can be performed. By performing high-speed reading, noise can be reduced by averaging signals read a plurality of times or the like.

Figure 12:
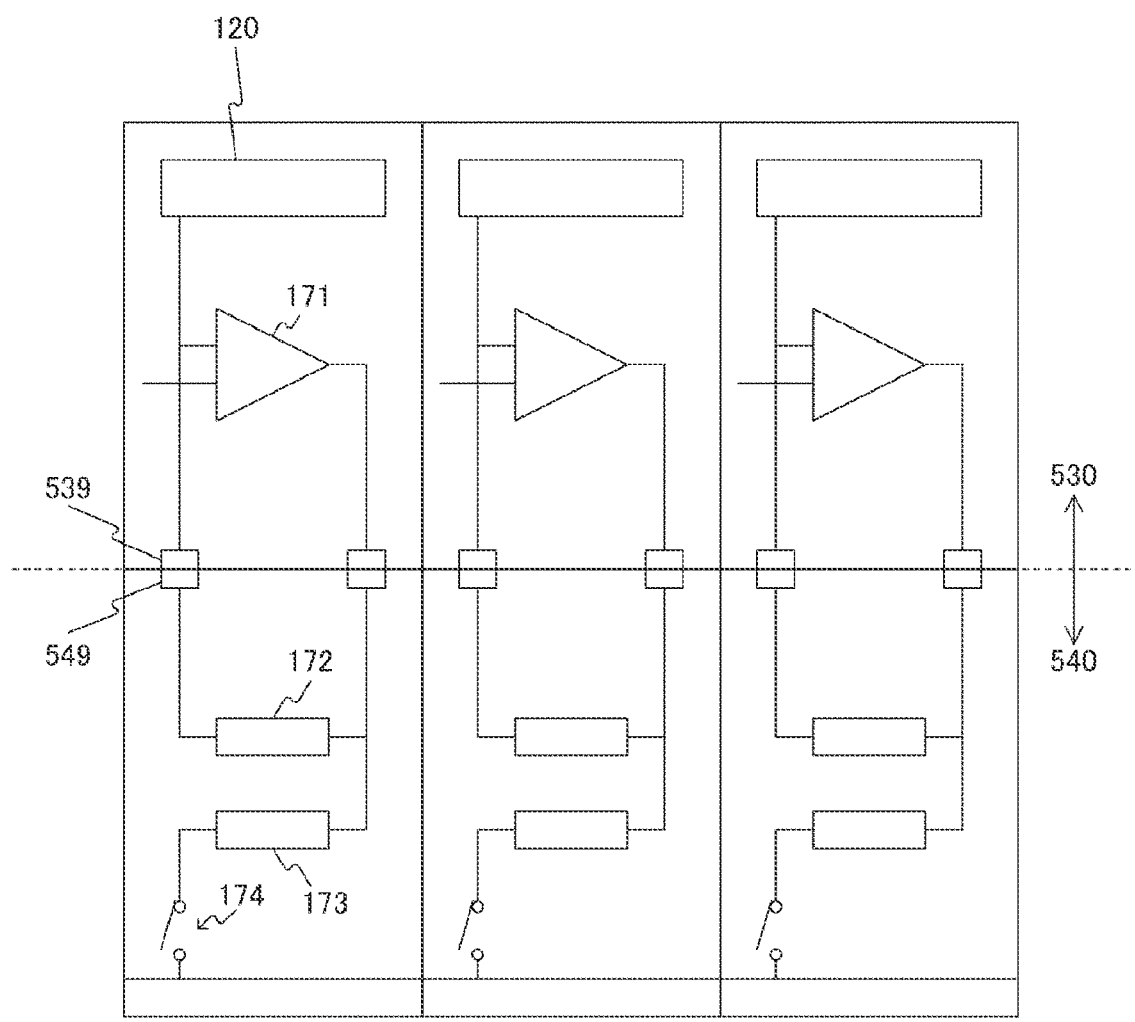
FIG. 12 is a diagram illustrating another example of the chip division in the fifth embodiment of the present technology.

FIG. 12 is a diagram illustrating another example of the chip division in the fifth embodiment of the present technology.

In this example, the frequency band limiting filters 172 and 173 are moved to a reading chip 540, and a land 539 formed on a sensing chip 530 and a land 549 formed on the reading chip 540 are connected. By moving the frequency band limiting filters 172 and 173 from the sensing chip 530, a required area in a plan direction can be reduced, and a pitch of the detection electrodes 120 can be reduced. Note that this division example is an example, and the way of division is not limited to this example.

As described above, according to the fifth embodiment of the present technology, the pitch of the detection electrodes 120 can be reduced by stacking at least a part of the reading circuit connected to the detection element as another chip. Thereby, high density of the charge detection sensor 10 can be achieved.

6. Sixth Embodiment

As described in the above embodiments, the charge in the solution can be detected by the charge detection sensor 10. In a sixth embodiment, an example of a case of applying a charge detection sensor 10 to a potential measurement system will be described.

Figure 13:
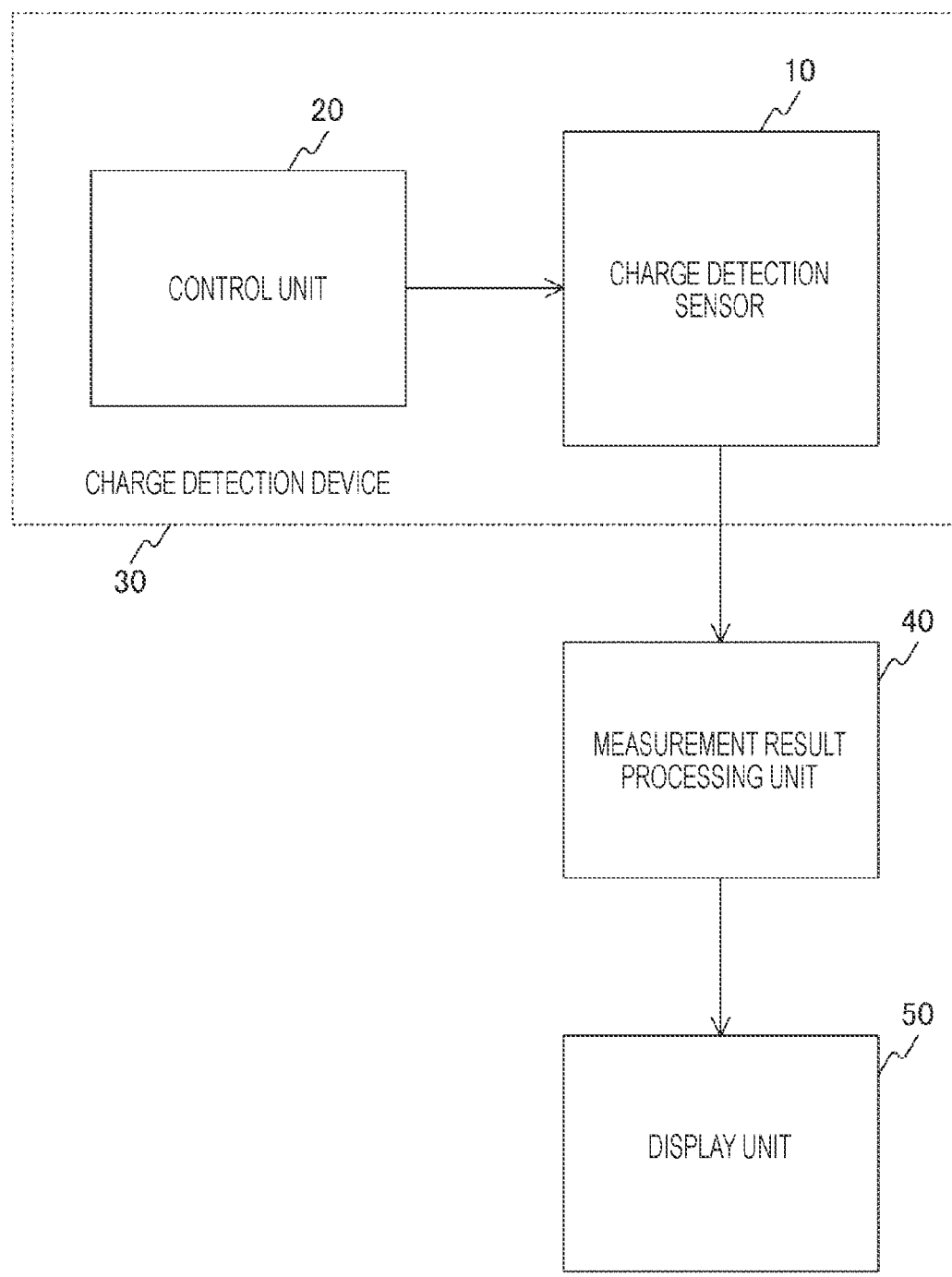
FIG. 13 is a diagram illustrating a configuration example of a potential measurement system according to a sixth embodiment of the present technology.

FIG. 13 is a diagram illustrating a configuration example of the potential measurement system according to the sixth embodiment of the present technology. The potential measurement system includes a control unit 20, a measurement result processing unit 40, and a display unit 50 in addition to the charge detection sensor 10 described in the above embodiments.

The charge detection sensor 10 detects a charge in each of a plurality of cells 12 as described above. Thereby, the charge detection sensor 10 can measure ions in a solution. Furthermore, thereby, the charge detection sensor 10 can measure a biological activity or specify a biological substance and functions as a biosensor.

The control unit 20 drives or controls the charge detection sensor 10. For example, the control unit 20 instructs the charge detection sensor 10 to start and terminate potential measurement, and controls selection of a measurement target.

The measurement result processing unit 40 processes a result measured by the charge detection sensor 10 on the basis of a preset reference. For example, to display a measurement result, the measurement result processing unit 40 performs processing such as converting measurement data and classifying numerical values of the measurement data into multiple stages.

The display unit 50 displays the measurement result processed by the measurement result processing unit 40. For example, the display unit 50 displays the measurement result as pixel colors and shades, and arranges and displays the pixel colors and shades in a two-dimensional manner, similarly to an element array, as an image indicating a distribution of charges or potentials. Furthermore, for example, the display unit 50 displays the image thus obtained as time elapses, thereby displaying the image as a moving image illustrating transition of the charges or potentials.

In this example, the charge detection sensor 10 and the control unit 20 constitute a charge detection device 30. For example, the charge detection device 30 may be installed on a measurement target and the measurement result may be stored. Then the stored measurement result may be processed by the measurement result processing unit 40. Furthermore, the charge detection device 30 may have a network function and remotely transmit the measurement result by the charge detection sensor 10 in real time to cause the measurement result processing unit 40 at a place distant from the charge detection device 30 to process the measurement result.

As described above, according to the sixth embodiment of the present technology, measurement is performed using the charge detection sensor 10 described in the above embodiments, and a result of the measurement can be displayed on the display unit 50.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Note that the effects described in the present specification are merely examples and are not limited, and other effects may be exerted Note that the present technology can also have the following configurations.

(1) A charge detection sensor including: a detection element provided on one surface of a semiconductor substrate and configured to detect a charge; a detection electrode provided on another surface different from the one surface of the semiconductor substrate; and a contact that penetrates the semiconductor substrate and electrically connects the detection electrode and the detection element.

(2) The charge detection sensor according to (1), in which the detection element is a MOSFET, and a gate of the detection element and the detection electrode are electrically connected via a conductor or a capacitor.

(3) The charge detection sensor according to (1) or (2), in which the contact includes a metal buried plug-type contact.

(4) The charge detection sensor according to (1) or (2), in which the contact includes a silicon through electrode-type contact.

(5) The charge detection sensor according to any one of (1) to (4), further including a wiring layer provided on the one surface of the semiconductor substrate and configured to connect the contact and a terminal of the detection element.

(6) The charge detection sensor according to any one of (1) to (4), in which the contact is directly connected to a terminal of the detection element.

(7) The charge detection sensor according to any one of (1) to (6), in which the semiconductor substrate is separated into a first semiconductor substrate and a second semiconductor substrate by an oxide film, the first semiconductor substrate is provided with the detection element, and the second semiconductor substrate is a highly doped substrate electrically connected with the detection electrode at a same potential.

(8) The charge detection sensor according to any one of (1) to (7), further including an element array in which pairs of the detection element and the detection electrode connected to the contact are arranged in a two-dimensional array manner.

(9) The charge detection sensor according to (8), further including a structure in which a first substrate including the element array and a second substrate including at least a part of a reading circuit that reads the detected charge are stacked and connected.

(10) The charge detection sensor according to (9), in which the connection between the first substrate and the second substrate is connection between copper electrodes.

(11) The charge detection sensor according to (9), in which the connection between the first substrate and the second substrate is connection between solder bumps.

(12) The charge detection sensor according to any one of (9) to (11), in which at least a part of the reading circuit connected to a plurality of the detection elements is integrated on the second substrate.

(13) The charge detection sensor according to any one of (9) to (11), in which a part of the reading circuit connected to the single detection element is divided into the first substrate and the second substrate.

(14) The charge detection sensor according to any one of (1) to (13), in which the detection element detects ions in a solution in contact with the detection electrode.

(15) The charge detection sensor according to any one of (1) to (14), in which the charge detection sensor is a biosensor configured to measure a biological activity or specify a biological substance by detecting the charge.

(16) A potential measurement system including: a charge detection sensor including a detection element provided on one surface of a semiconductor substrate and configured to detect a charge, a detection electrode provided on another surface different from the one surface of the semiconductor substrate, and a contact that penetrates the semiconductor substrate and electrically connects the detection electrode and the detection element, the charge detection sensor being configured to perform potential measurement;

a control unit configured to control the potential measurement in the charge detection sensor;

a measurement result processing unit configured to process a measurement result by the charge detection sensor; and a display unit configured to display the processed measurement result.

REFERENCE SIGNS LIST

10 Charge detection sensor
11 Detection region
12 Cell
13 Peripheral circuit
15 Sensing chip
16 Reading chip
17 Reading circuit
18 AD conversion circuit
20 Control unit
30 Charge detection device
40 Measurement result processing unit
50 Display unit
90 Solution
100 to 102 Semiconductor substrate
103 Oxide film
111 Gate
112 Source
113 Drain
114 Semiconductor substrate
116, 117 Power supply
118 Reference electrode
120 Detection electrode
130 Contact
131 to 133 Through contact
150 Insulating film
170 Reading circuit
171 Amplifier circuit
172, 173 Frequency band limiting filter
174 Switch 181 AD conversion circuit
200 Wiring layer
210, 280 Contact
220 Wiring
250 Ammeter
290, 490, 519, 529, 539, 549 Land
291, 491 Solder bump
300 Support substrate
401, 510, 530 Sensing chip
402, 520, 540 Reading chip
511 Cell
521 Peripheral circuit

What is claimed is:

1. A charge detection sensor, comprising:
a detection element on a first surface of a semiconductor substrate, wherein the detection element is configured to detect a charge;
a detection electrode on a second surface of the semiconductor substrate, wherein
the first surface is different from the second surface;
a contact that penetrates the semiconductor substrate, wherein
the contact is configured to electrically connect the detection electrode and the detection element;
an element array that includes a plurality of pairs of the detection element and the detection electrode connected to the contact in a two-dimensional array; and
a structure that includes:
a first substrate that includes the element array, wherein the first substrate corresponds to the semiconductor substrate; and
a second substrate that includes at least a part of a reading circuit, wherein
the reading circuit is configured to read the detected charge,
the first substrate is stacked on the second substrate, and
the first substrate is connected to the second substrate.

2. The charge detection sensor according to claim 1, wherein
the detection element is a MOSFET,
a gate of the detection element and the detection electrode are electrically connected via the contact that includes a conductor, and
a terminal of the detection element corresponds to the gate of the detection element.

3. The charge detection sensor according to claim 1, wherein the contact is a metal buried plug-type contact.

4. The charge detection sensor according to claim 1, further comprising a wiring layer on the first surface of the semiconductor substrate, wherein the wiring layer is configured to connect the contact and a terminal of the detection element.

5. The charge detection sensor according to claim 1, wherein connection between the first substrate and the second substrate is a connection between copper electrodes.

6. The charge detection sensor according to claim 1, wherein connection between the first substrate and the second substrate is a connection between solder bumps.

7. The charge detection sensor according to claim 1, wherein
the part of the reading circuit is connected to a plurality of detection elements,
the plurality of detection elements includes the detection element, and
the part of the reading circuit is integrated on the second substrate.

8. The charge detection sensor according to claim 1, wherein a part of the reading circuit connected to the detection element is divided into the first substrate and the second substrate.

9. The charge detection sensor according to claim 1, wherein the detection element is further configured to detect ions in a solution in contact with the detection electrode.

10. The charge detection sensor according to claim 1, wherein the charge detection sensor is a biosensor configured to at least one of measure a biological activity or specify a biological substance based on the detection of the charge.

11. A potential measurement system, comprising:
a charge detection sensor that includes:
a detection element on a first surface of a semiconductor substrate, wherein the detection element is configured to detect a charge;
a detection electrode on a second surface of the semiconductor substrate, wherein
the first surface is different from the second surface;
a contact that penetrates the semiconductor substrate, wherein
the contact is configured to electrically connect the detection electrode and the detection element, and
the charge detection sensor is configured to perform potential measurement;
an element array that includes a plurality of pairs of the detection element and the detection electrode connected to the contact in a two-dimensional array; and
a structure that includes:
a first substrate that includes the element array, wherein the first substrate corresponds to the semiconductor substrate; and
a second substrate that includes at least a part of a reading circuit, wherein
the reading circuit is configured to read the detected charge,
the first substrate is stacked on the second substrate, and
the first substrate is connected to the second substrate;
a control unit configured to control the potential measurement in the charge detection sensor;
a measurement result processing unit configured to process a measurement result by the charge detection sensor; and
a display unit configured to display the processed measurement result.

* * * * *